United States Patent [19]
Bowman et al.

[11] Patent Number: 4,654,469
[45] Date of Patent: Mar. 31, 1987

[54] SPECIAL PURPOSE BELLOWS ASSEMBLY

[75] Inventors: Gaylord I. Bowman, Yorba Linda; Frank J. DePhillipo, La Palma, both of Calif.

[73] Assignee: The United States of America as represented by the Secretary of the Air Force, Washington, D.C.

[21] Appl. No.: 25,603

[22] Filed: Mar. 25, 1970

[51] Int. Cl.⁴ .............................................. H05K 9/00
[52] U.S. Cl. ............................. 174/35 C; 339/143 R
[58] Field of Search ............ 174/35 R, 35 C, 355 M; 339/143 R, 143 S

[56] References Cited

U.S. PATENT DOCUMENTS 2,442,015  5/1948  Peters et al. ................. 339/143 S X
3,014,979 12/1961  Candelise et al. ........... 339/143 S X

OTHER PUBLICATIONS

Radio Engineering, by F. E. Terman, 1947, p. 36.

Primary Examiner—Richard A. Farley
Attorney, Agent, or Firm—Jacob N. Erlich; Donald J. Singer; Arsen Tashjian

[57] ABSTRACT

A bellows assembly to house and shield an electrical cable, and a connector attached thereto, from the effects of an electromagnetic pulse. The assembly includes: an expansible and contractable cylindrically shaped, flexible, bellows-like component made of magnetic material, having open ends, and with convolutions along its surface perpendicular to the axis of its length; a rigid transition cover made of magnetic material, having two apertures shaped to permit the passage of the electrical cable and connector attached thereto, positioned at one end of the bellows-like component; and, a spring-type clamp to attach the transition cover, at one of its openings, to one end of the bellows-like component. The other end of the bellows-like component is grounded.

1 Claim, 4 Drawing Figures

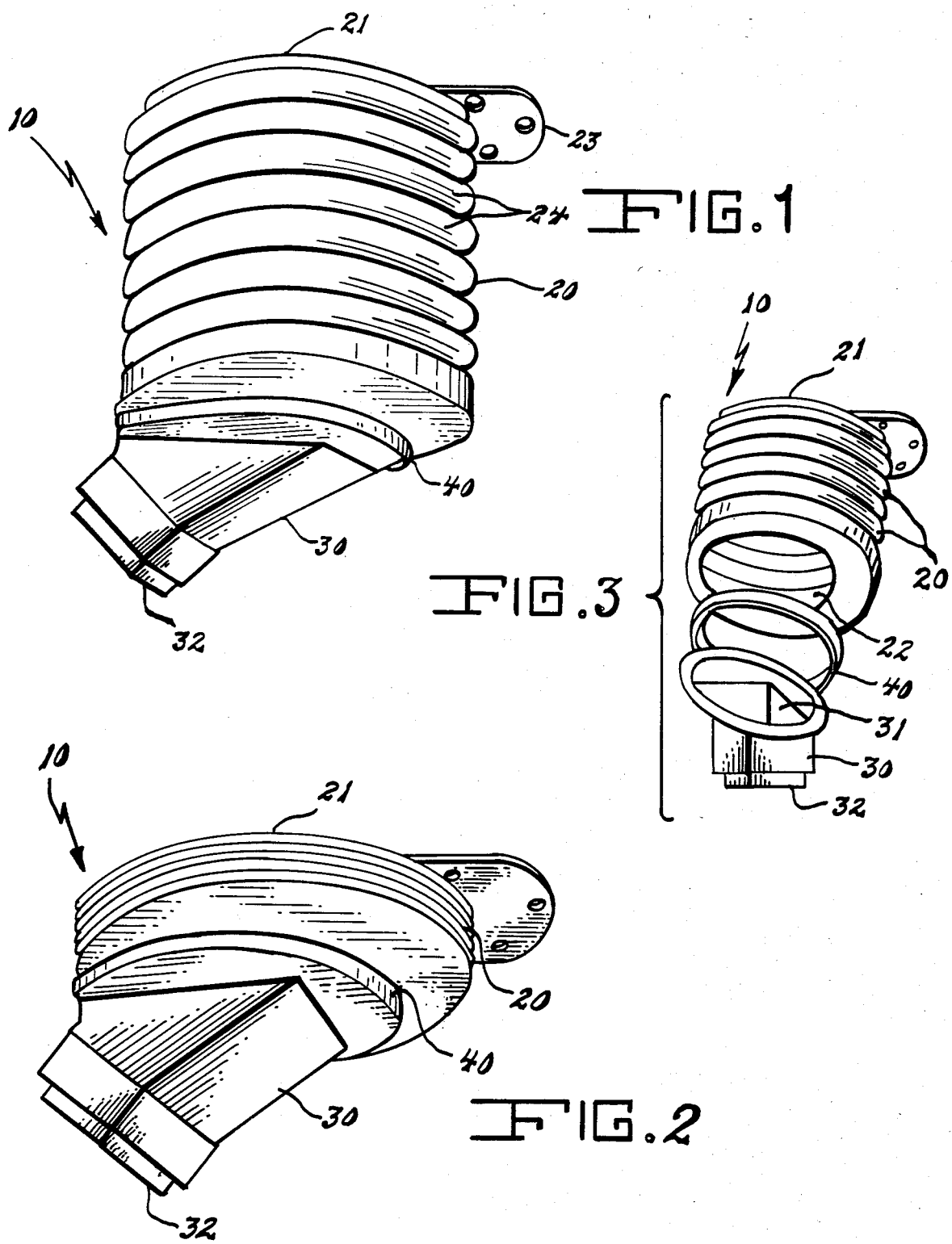

SPECIAL PURPOSE BELLOWS ASSEMBLY

BACKGROUND OF THE INVENTION

This invention relates to a bellows assembly and, more particularly, to a bellows assembly which houses and protects electrical cables, and connectors attached thereto, from the effects of an electromagnetic pulse.

It is well known that a nuclear burst results in, among other phenomenon, an electromagnetic pulse, hereinafter referred to as "EMP". The EMP, although transient in nature, may result in permanent and irreparable damage to unhardened electrical and electronic components within the nuclear burst environment. The term "unhardened," as used herein, is intended to mean "not protected from the effects of a nuclear blast." Conversely, the term "hardened" means so protected. It is obvious, therefore, that the protection of United States weaponry which uses electrical cables, such as the Minuteman II missile, against an EMP is in the interest of national defense.

In this connection, it should be noted that it is frequently required that the Missile Guidance Set of the missile be raised from the third stage thereof. When this is done, an unhardened electrical cable and a connector thereto from the Missile Guidance Set (hereinafter referred to as MGS) to the third stage is left unprotected from, and is vulnerable to, an EMP.

Therefore, there is a critical need for an apparatus which will protect the mentioned unhardened electrical cable and connector from an EMP, and which is expansible and contractable to permit the raising and lowering of the MGS from the third stage of the missile.

This invention fulfills that need and, thereby, advances the state-of-the-art.

SUMMARY OF THE INVENTION

This invention relates to an apparatus for protecting, i.e., shielding, an electrical cable and a connector attached thereto, such as exist on the Minuteman II missile, from the effects of an EMP generated by a nuclear burst.

The general object of this invention is to provide shielding to unhardened electrical and electronic components against a nuclear burst-generated EMP.

The more specific object of this invention is to protect an electrical cable, and connector thereto, from the MGS to the third stage of the Minuteman II missile, against an EMP generated by a nuclear burst. An object related to this is to provide shielding which, after installation over the cable, is also capable of being contracted or compressed to fit in the limited space between the bottom of the MGS and the top of the third stage. Another object relates to the specific object is to provide shielding which, after installation over the cable, is capable of being expanded to permit the raising of the MGS from the third stage without sacrificing pulse shielding of the cable.

These, and still other and related, objects of this invention will become readily apparent after a consideration of the description of the invention and reference to the drawings.

DESCRIPTION OF THE DRAWINGS

FIG. 1 is a side elevation of a preferred embodiment of the invention in the expanded mode;

FIG. 2 is a side elevation of the preferred embodiment of the invention in the compressed mode;

FIG. 3 is a perspective view of the preferred embodiment, disassembled to show the components thereof.

DESCRIPTION OF THE EMBODIMENT

Figure 4:
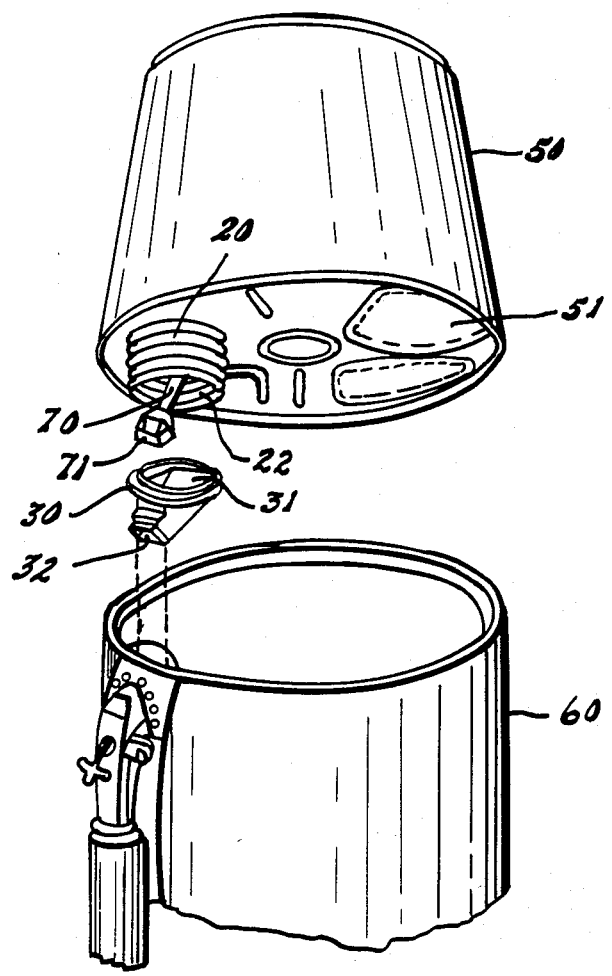
FIG. 4 is a view of the positioning of the embodiment in connection with a particular adaptation.

With reference to FIG. 1, therein is shown, in side elevation, a preferred embodiment of the invention. The embodiment 10, a bellows assembly, includes a bellows-like component 20 (hereinafter referred to as the bellows), a transition cover 30, and means such as spring-type clamp 40 (hereinafter referred to as the coupling ring) to attach or connect bellows 20 to transition cover 30. Bellows 20 is flexible; is cylindrical in form and shape; is open-ended with upper opening 21, and with lip or flange 23 protruding from the periphery of upper opening 21; is made of a magnetic material, such as a magnetic alloy, preferably "Hipernom," a nickel-iron-molybdenum alloy manufactured and sold by the Westinghouse Electric Corporation; has convolutions, such as 24, along its surface perpendicular to the axis of its length, i.e., its height in FIG. 1; and is contractable and expansible. Bellows 20 is shown in FIG. 1 in the expanded mode. Transition cover 30 is rigid; is formed, and has apertures such as lower aperture 32, to permit the passage and the housing of a connector and the lead or cable attached thereto; and is also made of magnetic material, such as a magnetic alloy, preferably "Hipernom," heretofore described.

In FIG. 2 bellows assembly 10 is shown in a contracted or compressed mode. Shown are bellows 20 with upper opening 21, transition cover 30 with lower aperture 32, and coupling ring 40.

With reference to FIG. 3, therein is shown bellows assembly 10 in disassembled form. Shown are bellows 21 with upper opening 21 and lower opening 22, transition cover 30 with upper aperture 31 and lower aperture 32, and coupling ring 40.

In FIG. 4 is shown bellows assembly 10 in an exploded view, showing how it is positioned in connection with a particular adaptation. More specifically, bellows assembly 10 is shown as it is positioned between the bottom 51 of the MGS 50 and the top of the third stage 60 of the Minuteman missile. Also shown is the relative positioning of MGS cable 70 and cable connector 71.

With reference to FIGS. 1–4, and particularly with reference to FIG. 4, it is to be noted that bellows 20 is of sufficient flexibility, and that bellows 20 and transition cover 30 are of sufficient length, to permit installation extending the length of electrical cable 70, FIG. 4, and connector 71, FIG. 4, and to permit the housing, i.e., the complete enclosure, of electrical cable 70 and connector 71.

MODE OF OPERATION OF THE PREFERRED EMBODIMENT

Bellows assembly 10, FIGS. 1–4, is installed between the bottom 51 of the MSG 50, FIG. 4, and the top of the third stage 60, FIG. 4, of the Minuteman II missile as follows: Electrical cable 70, FIG. 4, and connector 71, FIG. 4, are threaded through upper opening 21, FIGS. 1–3, and lower opening 22, FIGS. 3 and 4, of bellows 20, FIGS. 1–4. Then, the transition cover 30, FIGS. 1–4, is slipped over connector 71 and said connector is mated with another (not shown) on the top of third stage 60. Thereafter, lower opening 22 of bellows 20 is attached to upper aperture 31, FIGS. 3 and 4, of transition cover 30 by suitable means, such as coupling ring 40, FIGS. 1-3. Lower aperture 32, FIGS. 1-4, of transition cover 30 forms a loose sliding fit over connector 71. Lip or flange 23, FIG. 1, of bellows 20 is attached or affixed to bottom 51 of MSG 50, thereby grounding bellows assembly 10.

Bellows assembly 10, as installed, provides shielding for cable 70 and connector 71 against an EMP and, additionally, expands and contracts to permit the raising and lowering of MSG 50 from the third stage 60. In this connection it is noted that the testing of an eight inch long bellows, such as 20, established that it was readily compressible from eight inches to one inch and was readily expandable from one inch to eight inches.

While there has been shown and described the fundamental features of the invention, as applied to a particular embodiment, it is to be understood that this is by way of illustration only and is not intended as a limitation, and that various substitutions and omissions may be made by those of ordinary skill in the art without departing from the spirit of the invention.

Additionally, although reference has been made to application of the invention to the shielding of an electrical cable, and connector attached thereto, from an EMP, obviously the invention may be modified for use in shielding other electrical components from an EMP.

What is claimed is:

1. An apparatus for housing and shielding an electrical cable, and a connector attached thereto, from an electromagnetic pulse, comprising:
    a. an expansible and contractable cylindrically shaped, flexible, bellows-like component made of magnetic material, and having open ends, and with convolutions along its surface perpendicular to the axis of its length;
    b. a rigid transition cover made of magnetic material and having two apertures shaped to permit the passage of the electrical cable and connector attached thereto;
    c. and, means for attaching one end of said bellows-like component to one of the apertures of said transition cover;
   whereby the electrical cable and connector attached thereto are shielded from an electromagnetic pulse when housed in said apparatus and when the other end of said bellows-like component is grounded.

* * * * *